(12) United States Patent
Heeney et al.

(10) Patent No.: US 7,126,013 B2
(45) Date of Patent: Oct. 24, 2006

(54) MONO-, OLIGO- AND POLYMERS COMPRISING FLUORENE AND ARYL GROUPS

(75) Inventors: Martin Heeney, Southampton (GB); Steven Tierney, Southampton (GB); Marcus Thompson, Christchurch Dorset (GB); Iain Mc Culloch, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 417 days.

(21) Appl. No.: 10/793,812

(22) Filed: Mar. 8, 2004

(65) Prior Publication Data

US 2004/0176560 A1    Sep. 9, 2004

(30) Foreign Application Priority Data

Mar. 7, 2003    (EP) ................................ 03004925

(51) Int. Cl.
- *C07D 409/00* (2006.01)
- *B32B 9/00* (2006.01)
- *C08F 2/00* (2006.01)
- *C08G 10/02* (2006.01)

(52) U.S. Cl. .................. 549/59; 428/690; 526/220; 528/244

(58) Field of Classification Search .............. 549/59; 428/690; 526/220; 528/244
See application file for complete search history.

(56) References Cited

U.S. PATENT DOCUMENTS

| | | | |
|---|---|---|---|
| 6,396,190 B1 * | 5/2002 | Ahn et al. ................ | 310/261 |
| 6,495,273 B1 | 12/2002 | Hwang et al. | |
| 6,984,737 B1 * | 1/2006 | Hartmann et al. ........... | 549/68 |
| 7,014,796 B1 * | 3/2006 | Jen et al. ................... | 252/582 |
| 7,015,336 B1 * | 3/2006 | Reed et al. ................. | 549/59 |
| 7,029,606 B1 * | 4/2006 | Dalton et al. .............. | 252/582 |
| 7,057,054 B1 * | 6/2006 | Irie ........................... | 549/59 |

FOREIGN PATENT DOCUMENTS

| | | |
|---|---|---|
| EP | 1 323 762 | 7/2003 |
| WO | WO 00/46321 | 8/2000 |

OTHER PUBLICATIONS

S. Tirapattur et al., "Spectroscopic Study of Intermolecular Interactions in Various Oligofluorenes: Precursors of Light-Emitting Polymers", Journal of Physical Chemistry, vol. 106, (2002), pp. 8959-8966.

\* cited by examiner

*Primary Examiner*—Deborah C. Lambkin
(74) *Attorney, Agent, or Firm*—Millen, White, Zelano, Branigan, P.C.

(57) ABSTRACT

Mono-, oligo- or polymers comprising at least one 9-H,H-fluorene group and at least one arylene group are suitable for use as semiconductors or charge transport materials in optical, electrooptical or electronic devices including field effect transistors, electroluminescent, photovoltaic and sensor devices.

28 Claims, No Drawings

MONO-, OLIGO- AND POLYMERS COMPRISING FLUORENE AND ARYL GROUPS

FIELD OF INVENTION

The invention relates to mono-, oligo- or polymers, in particular conjugated copolymers, comprising 9-H,H-fluorene and aryl groups. The invention further relates to methods of their preparation, to their use as semiconductors or charge transport materials in optical, electrooptical or electronic devices including field effect transistors, electroluminescent, photovoltaic and sensor devices. The invention further relates to field effect transistors and semiconducting components comprising the new materials.

BACKGROUND AND PRIOR ART

Organic materials have recently shown promise as the active layer in organic based thin film transistors and organic field effect transistors [see H. E. Katz et al., *Acc. Chem. Res.*, 2001, 34, 5, p.359]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1 \times 10^{-3}$ cm$^2$V$^{-1}$s$^{-1}$). In addition, it is important that the semiconducting material is relatively stable to oxidation, i.e. it has a high ionisation potential, as oxidation leads to reduced device performance.

Compounds known in prior art which have been shown to be effective p-type semiconductors for organic FETs are dithieno-hiophene (DTT) (1a) and its fused dimer α,α'-bis(dithieno 3,2-b:2',3'-d]thiophene (BDT) (1b) having the structures shown below [see H. Sirringhaus et al., *Appl. Phys. Lett.*, 1997, 71, 26, p.3871; Li et al., *J. Am. Chem. Soc.*, 1998, 120, p.2206; J. J. Morrison et al., *Synth. Met.*, 1999, 102, p.987].

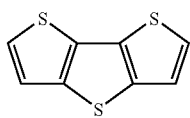

1a DTT

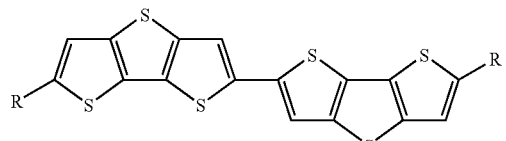

1b R = H BDT
1c R = Alkyl

In particular BDT, which has been extensively studied, has been shown to be an effective p-type semiconductor for organic FETs with a very high charge carrier mobility between $1 \times 10^{-3}$ and $5 \times 10^{-2}$ cm$^2$V$^{-1}$s$^{-1}$ and very high current on/off ratios (up to $10^8$). BDT also has been found in the solid state to have a completely coplanar formation, and to be more planar than oligomers of thiophene.

However, BDT has a high melting point and is very insoluble, therefore, if used as the active layer in an organic thin film transistor, it cannot be readily solution processed. As a result, for applications like FETs, prior art materials like BDT are usually deposited as a thin film by vacuum deposition, which is an expensive processing technique that is unsuitable for the fabrication of large-area films. To improve the solubility of BDT, several substituted derivatives have so far been synthesized (1c), [see J. J. Morrison et al., *Synth. Met.*, 1999, 102, p.987] but these have still required vacuum processing when used in thin film transistors.

It is an aim of the present invention to provide new materials for use as semiconductors or charge transport materials, which are easy to synthesize, have high charge mobility and are easily processible to form thin and large-area films for use in semiconductor devices. Other aims of the invention are immediately evident to those skilled in the art from the following description.

The inventors have found that these aims can be achieved by providing new aryl copolymers of 9-H,H-fluorene.

9,9-Dialkylfluorene (2) containing (co)polymers have been extensively investigated as a class of soluble material for organic light emitting diode (OLED) applications [see M. T. Bernius et al., *Adv. Mater.*, 2000, 12(23), p.1737; U. Scherf et al., *Adv. Mater.*, 2002, 14(7), p.477]. For OLED applications, it is desirable to prevent aggregation of the polymer backbones which can lead to excimer quenching. The 9,9-dialkyl substituents help to provide solubility for the polymer and also pack orthogonal to the polymer backbone, thus helping to prevent aggregation of the polymer chains.

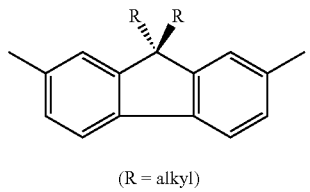

(R = alkyl)

U.S. Pat. No. 5,708,130 and U.S. Pat. No. 6,169,163 disclose polymers of 9,9'-disubstituted fluorene as shown in structure (3), wherein R is C$_{1-20}$-hydrocarbyl that may also contain hetero atoms. WO 00/22026 discloses polymers of 9,9'-disubstituted fluorene wherein R is aryl or heteroaryl. U.S. Pat. No. 6,353,083 discloses copolymers of 9-substituted or 9,9'-disubstituted fluorene with two other different monomers. These documents further suggest to use the polymers for OLEDs.

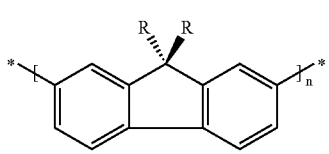

Bin Liu et al., *Macromolecules*, 2000, 33, p.8945 report the synthesis of copolymers of 9,9'-dihexylfluorene and decylthiophene and the investigation of these materials for OLED applications.

WO 02/45184 discloses a field effect transistor (FET) comprising an organic semiconductor and a binder, wherein the semiconductor may, inter alia, comprise polymers of structure (3) above, wherein R is selected from H, alkyl, aryl or substituted aryl.

H. Sirringhaus et al., Appl. Phys. Lett., 2000, 77(3), p.406 report poly-9,9-dioctyl-fluorene-co-bithiophene (4, F8T2) to show reasonable mobility ($10^{-2}$ $cm^2V^{-1}s^{-1}$) in a field effect transistor despite the presence of octyl chains on the $Sp^3$-carbon of the fluorene bridge. This good mobility is a consequence of the liquid crystalline behaviour of the polymer, which allows control of the morphology of the semiconductor in the transistor. Specifically, the polymer is annealed in its nematic liquid crystal phase at 275–285° C. and aligned on a rubbed polyimide layer in the direction of charge transport before quenching to 'freeze in' the order.

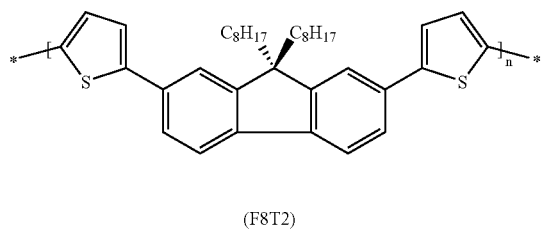

(F8T2)

However, fluorene co-polymers of prior art which are substituted at the $sp^3$ carbon atom in 9-position with hydrocarbon groups have the disadvantage that the $sp^3$ dialkyl bridge disrupts close packing, which negatively affects charge transport.

In contrast, the present invention relates to unsubstituted fluorene co-polymers which are not substituted at the $sp^3$ carbon in 9-position of the fluorene bridge but retain mesogenic behaviour. The absence of chains at the fluorene bridge facilitates closer packing of the polymer backbones and improved charge transport. Solubilising side-chains can now be present on, for example, a thiophene co-monomer, and are thus able to lie in the plane of the polymer backbone, therefore not disrupting the packing of polymer chains. Furthermore, this approach affords polymers which exhibit liquid crystalline behaviour at lower temperatures. Thus, some of the materials of the present invention exhibit liquid crystallinity already at temperatures around 150° C., which is considerably lower than, for example, the polymer F8T2 of prior art, which has a nematic phase at a temperature of 265° C. or higher, and enables lower processing temperatures, e.g. in the fabrication of FET devices.

A further aspect of the invention relates to reactive mesogens having a central core comprising 9-H,H-fluorene and arylene units, said core being linked, optionally via a spacer group, to one or two polymerisable groups. The reactive mesogens can induce or enhance liquid crystal phases or are liquid crystalline themselves. They can be oriented in their mesophase and the polymerisable group(s) can be polymerised or crosslinked in situ to form polymer films with a high degree of order, thus yielding improved semiconductor materials with high stability and high charge carrier mobility.

A further aspect of the invention relates to liquid crystal polymers like liquid crystal main chain or side chain polymers, in particular liquid crystal side chain polymers, obtained from the reactive mesogens according to the present invention, which are then further processed, e.g., from solution as thin layers for use in semiconductor devices.

SUMMARY OF THE INVENTION

The invention relates to mono-, oligo- or polymers comprising at least one 9-H,H-fluorene group and at least one arylene or heteroarylene group The invention further relates to a semiconductor or charge transport material, component or device comprising at least one mono-, oligo- or polymer as defined above.

The invention further relates to the use of polymers according to the invention as semiconductors or charge transport materials, in particular in optical, electrooptical or electronic devices, like for example in field effect transistors (FET) as components of integrated circuitry, as thin film transistors in flat panel display applications or for Radio Frequency Identification (RFID) tags, or in semiconducting components for organic light emitting diode (OLED) applications such as electroluminescent displays or backlights of e.g. liquid crystal displays (LCD), for photovoltaic or sensor devices, as electrode materials in batteries, as photoconductors and for electrophotographic applications like electrophotographic recording.

The invention further relates to the use of the novel mono-, oligo- and polymers according to the present invention as electroluminescent materials, in photovoltaic or sensor devices, as electrode materials in batteries, as photoconductors, for electrophotographic applications like electrophotographic recording and as alignment layers in LCD or OLED devices.

The invention further relates to an optical, electrooptical or electronic device, FET, integrated circuit (IC), TFT, OLED or alignment layer comprising a semiconducting or charge transport material, component or device according to the invention.

The invention further relates to a TFT or TFT array for flat panel displays, radio frequency identification (RFID) tag, electroluminescent display or backlight comprising a semiconducting or charge transport material, component or device or a FET, IC, TFT or OLED according to the invention.

The invention further relates to a security marking or device comprising a FET or an RFID tag according to the invention.

DETAILED DESCRIPTION OF THE INVENTION

The mono-, oligo and polymers according to the invention are especially useful as charge transport semiconductors in that they have high carrier mobilities.

In the mono-, oligo and polymers according to the present invention the 9-H,H-fluorene group can be unsubstituted or substituted in other than the 9-position. The arylene group can be substituted or unsubstituted and optionally comprises one or more hetero atoms.

In a preferred embodiment of the present invention, the 9-H,H-fluorene group is substituted in other than 9-position by one or more alkyl or fluoroalkyl groups. The introduction of fluoroalkyl and alkyl side chains into the 9-H,H-fluorene group improves their solubility and, therefore, their solution processibility. Furthermore, the presence of fluoroalkyl side chains also renders the materials of the present invention effective as n-type semiconductors. The electron-withdrawing nature of the fluoroalkyl substituents will also lower the HOMO (Highest Occupied Molecular Orbital energy level) further and result in a more stable material, which is less susceptible to oxidation.

Particularly preferred are mono-, oligo-, and polymers having one or more identical or different recurring units of formula I

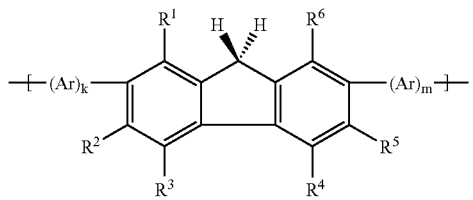

wherein $R^1$ to $R^6$ are independently of each other H, halogen or straight chain, branched or cyclic alkyl with 1 to 20 C-atoms, which may be unsubstituted, mono- or poly-substituted by F, Cl, Br, I and/or CN, wherein optionally one or more non-adjacent $CH_2$ groups of the alkyl radical are replaced, in each case independently from one another, by —O—, —S—, —NH—, —NR$^0$—, —SiR$^0$R$^{00}$—, —CO—, —COO—, —OCO—, —OCO—O—, —S—CO—, —CO—S—, —CH=CH— or —C≡C— in such a manner that O and/or S atoms are not linked directly to one another, optionally substituted aryl or heteroaryl, or P-Sp-, P is a polymerisable or reactive group, Sp is a spacer group or a single bond, $R^0$ and $R^{00}$ are independently of each other H or alkyl with 1 to 12 C-atoms, and Ar is an arylene or heteroarylene group that is optionally substituted with one or more groups $R^1$, and k and m are independently of each other 0, 1, 2, 3 or 4, with k+m>1.

Particularly preferred are mono-, oligo-, and polymers of formula I1

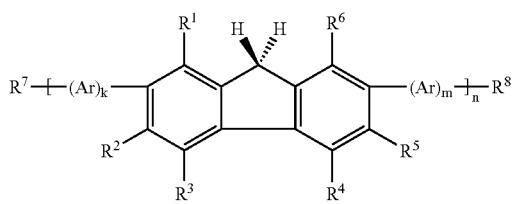

wherein $R^{1-6}$, Ar, k and m have, independently of each other, one of the meanings of formula I, $R^7$ and $R^8$ are independently of each other H, halogen, Sn(R$^0$)$_3$ or straight chain, branched or cyclic alkyl with 1 to 20 C-atoms, which may be unsubstituted, mono- or poly-substituted by F, Cl, Br, I, —CN and/or —OH, it being also possible for one or more non-adjacent $CH_2$ groups to be replaced, in each case independently from one another, by —O—, —S—, —NH—, —NR$^0$—, —SiR$^0$R$^{00}$—, —CO—, —COO—, —OCO—, —OCO—O—, —S—CO—, —CO—S—, —CH=CH— or —C≡C— in such a manner that O and/or S atoms are not linked directly to one another, optionally substituted aryl or heteroaryl, or P-Sp, n is an integer from 1 to 10000, and wherein the recurring units may be identical or different.

The recurring units of formula I are hereinafter also abbreviated as [(Ar)$_k$-fl-(Ar)$_m$] wherein fl is a 9-H,H-fluorene unit as shown in formula I and Ar, k, and m are as defined in formula I.

In the oligo- and polymers of the present invention the recurring units [(Ar)$_k$-fl-(Ar)$_m$] in case of multiple occurrence can be selected of formula I independently of each other, so that an oligo- or polymer may comprise identical or different recurring units [(Ar)$_k$-fl-(Ar)$_m$]. The oligo- and polymers thus include homopolymers and copolymers like for example statistically random copolymers, for example with a monomer sequence such as -fl-Ar—Ar-fl-fl-fl-Ar-fl-Ar—, alternating copolymers with the monomer sequence -fl-Ar-fl-Ar-fl-Ar-fl-Ar—, and block copolymers, for example with a monomer sequence such as -fl-fl-fl-fl-fl-Ar—Ar—Ar—Ar—Ar—Ar-fl-fl-fl-fl-fl-fl-, wherein the groups fl and Ar preferably together form a conjugated system, and wherein multiple groups (for example each group fl in the sequence -fl-fl-fl-fl-, or each group Ar in the sequence —Ar—Ar—Ar—Ar—Ar—Ar—) can be identical or different from one another.

Especially preferred are mono-, oligo- and polymers comprising one or more recurring units [(Ar)$_k$-fl-(Ar)$_m$], wherein k is 0, m is 1, all groups fl have the same meaning and all groups Ar have the same meaning, very preferably mono-, oligo- and polymers consisting exclusively of such recurring units.

Further preferred are mono-, oligo-, and polymers of formula I and I1 having identical recurring units.

Further preferred are mono-, oligo-, and polymers of formula I and I1 wherein $R^{1-6}$ are H.

Especially preferred are mono-, oligo-, and polymers of formula I and I1 having a degree of polymerisation (number n of recurring units) from 2 to 5000, in particular from 10 to 5000, very preferably from 100 to 1000.

Further preferred are mono-, oligo-, and polymers of formula I and I1 having a molecular weight from 5000 to 300000, in particular from 20000 to 100000.

Especially preferred are regioregular polymers of formula I and I1. The regioregularity in these polymers is preferably at least 90%, in particular 95% or more, very preferably 98% or more, most preferably from 99 to 100%.

Regioregular polymers are advantageous as they show strong interchain pi-pi-stacking interactions and a high degree of crystallinity, making them effective charge transport materials with high carrier mobilities.

Further preferred are mono-, oligo- and polymers of formula I and I1 comprising at least one reactive group P that is capable of a polymerisation or crosslinking reaction.

Further preferred are mono-, oligo-, and polymers of formula I and I1 that are mesogenic or liquid crystalline, in particular polymers forming calamitic phases, and reactive mesogens of formula I or I1 comprising one or more groups P-Sp-, forming calamitic phases.

Further preferred are mono-, oligo- and polymers of formula I and I1 shown above and below wherein m is 1, 2 or 3, preferably 1 or 2, k is 0, 1 or 2, preferably 0 or 1, n is an integer from 1 to 15, preferably 1, and one or both of $R^7$ and $R^8$ denote P-Sp-, at least one of $R^{1-6}$ denotes P-Sp-, n is an integer from 2 to 5000 and $R^7$ and $R^8$ are different from P-Sp-, $R^1$ to $R^6$ are selected from $C_1$–$C_{20}$-alkyl that is optionally substituted with one or more fluorine atoms, $C_1$–$C_{20}$-alkenyl, $C_1$–$C_{20}$-alkynyl, $C_1$–$C_{20}$-alkoxy, $C_1$–$C_{20}$-thioalkyl, $C_1$–$C_{20}$-silyl, $C_1$–$C_{20}$-ester, $C_1$–$C_{20}$-amino, $C_1$–$C_{20}$-fluoroalkyl, $(CH_2CH_2O)_m C_l H_{2l+1}$ with m being an integer from 1 to 6 and l being 1, 2, or 3, and optionally substituted aryl or heteroaryl, very preferably $C_1$–$C_{20}$-alkyl or $C_1$–$C_{20}$-fluoroalkyl, $R^7$ and $R^8$ are selected from H, halogen, $Sn(R^0)_3$, $CH_2Cl$, COH, $CH=CH_2$ $SiR^0R^{00}$ and optionally substituted aryl or heteroaryl, n>1.

Ar is preferably a mono-, bi- or tricyclic aromatic or heteroaromatic group with up to 25 C atoms, wherein the rings can be fused, and in which the heteroaromatic group contains at least one hetero ring atom, preferably selected from N, O and S. It is optionally substituted with one or more of F, Cl, Br, I, CN, and straight chain, branched or cyclic alkyl having 1 to 20 C atoms, which is unsubstituted, mono- or poly-substituted by F, Cl, Br, I, —CN or —OH, and in which one or more non-adjacent $CH_2$ groups are optionally replaced, in each case independently from one another, by —O—, —S—, —NH—, —$NR^0$—, —$SiR^0R^{00}$—, —CO—, —COO—, OCO—, —OCO—O, —S—CO—, —CO—S—, —CH=CH— or —C≡C— in such a manner that O and/or S atoms are not linked directly to one another.

Preferred groups Ar are phenyl, fluorinated phenyl, pyridine, pyrimidine, biphenyl, naphthalene, thiophene, fluorinated thiophene, benzo[1,2-b:4,5-b']dithiophene, cyclopenta[2,1-b:3,4-b']dithiophene, 9-alkylidenefluorene, 9-H,H-fluorene, thiazole and oxazole, all of which are unsubstituted, mono- or polysubstituted with $R^1$ as defined above, preferably with L, wherein L is F, Cl, Br, or an alkyl, alkoxy, alkylcarbonyl or alkoxycarbonyl group with 1 to 12 C atoms, wherein one or more H atoms are optionally replaced by F or Cl.

Very preferably Ar is thiophene-2,5-diyl that is optionally substituted in 3- or 4-position by $R^1$ or L. $R^1$ in these preferred groups is preferably $C_1$–$C_{20}$-alkyl that is optionally substituted with one or more fluorine atoms, $C_1$–$C_{20}$-alkenyl, $C_1$–$C_{20}$-alkynyl, $C_1$–$C_{20}$-alkoxy, $C_1$–$C_{20}$-thioalkyl, $C_1$–$C_{20}$-silyl, $C_1$–$C_{20}$-ester, $C_1$–$C_{20}$-amino, $C_1$–$C_{20}$-fluoroalkyl, $(CH_2CH_2O)_m C_l H_{2l+1}$ with m being an integer from 1 to 6 and l being 1, 2, or 3, and optionally substituted aryl or heteroaryl, very preferably $C_1$–$C_{20}$-alkyl or $C_1$–$C_{20}$-fluoroalkyl.

Especially preferred are compounds of the following formulae

Ia

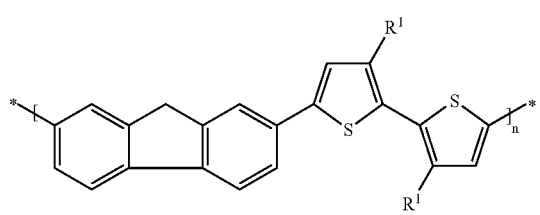

-continued

Ib

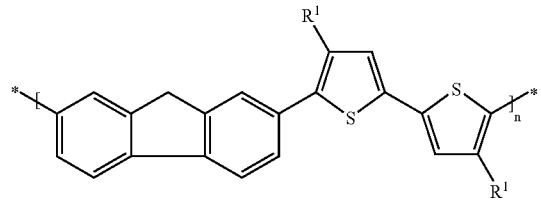

Ic

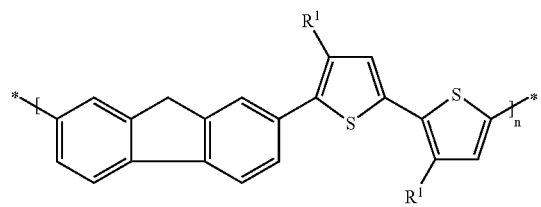

Id

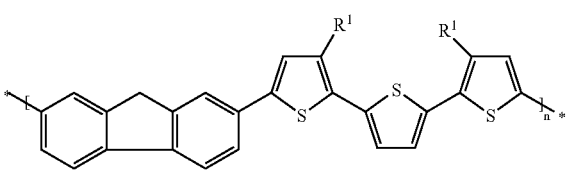

Ie

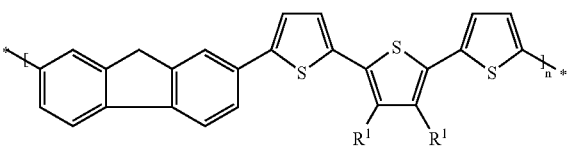

If

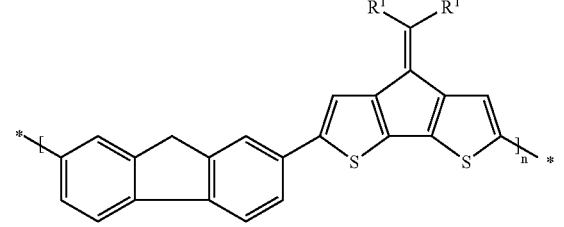

Ig

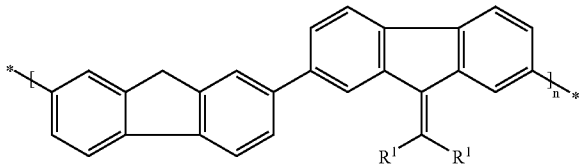

Ih

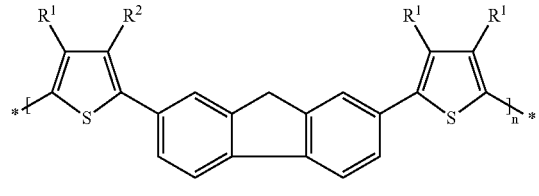

Ii

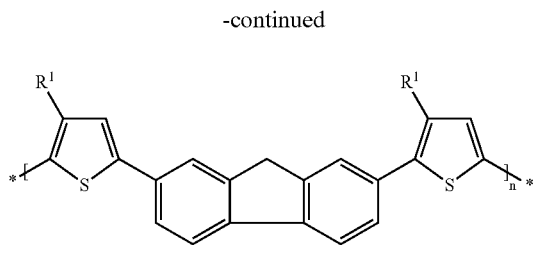

Ik

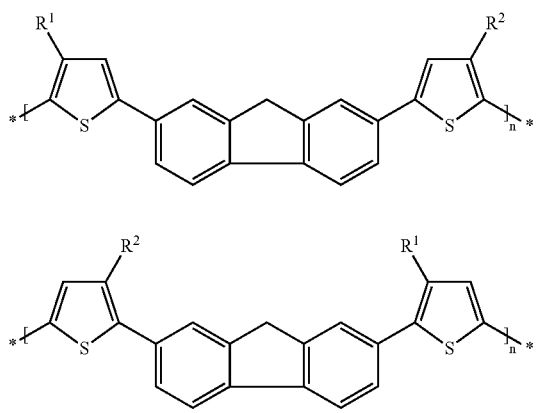

Im wherein R¹, R² and n are as defined above.

Further preferred are monomers of the following formulae

I1h

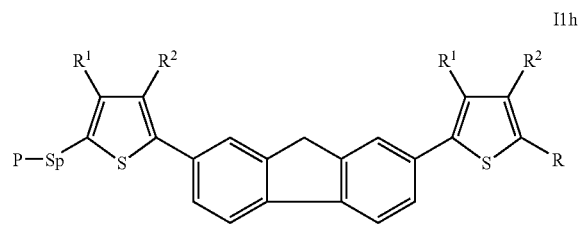

I1i1

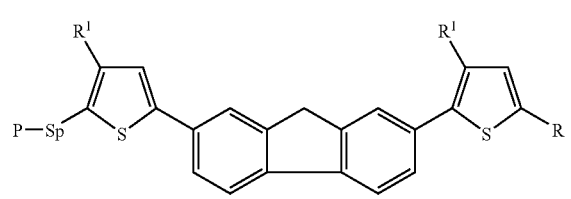

I1i2

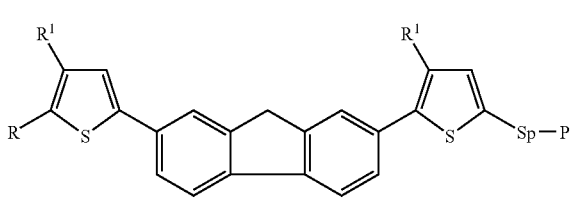

I1k

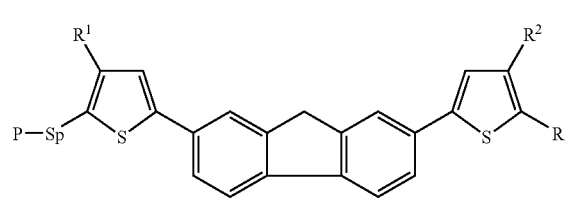

I1m

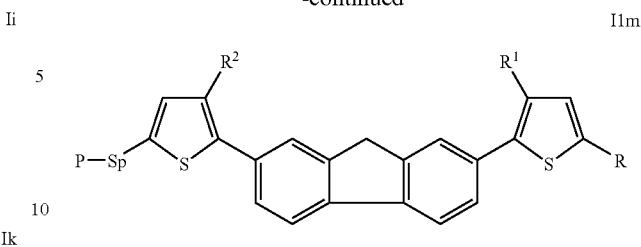

wherein P, Sp, R¹ and R² are as defined above and R has one of the meanings of $R^7$. Preferably, R is P-Sp-. Further preferably R¹ and R² are H. If R is P-Sp, the two groups P or the two groups Sp, respectively, can be identical or different.

If one of $R^{1-8}$ is aryl or heteroaryl, it is preferably a mono-, bi- or tricyclic aromatic or heteroaromatic group with up to 25 C atoms, wherein the rings can be fused, and in which the heteroaromatic group contains at least one hetero ring atom, preferably selected from N, O and S. It is optionally substituted with one or more of F, Cl, Br, I, CN, and straight chain, branched or cyclic alkyl having 1 to 20 C atoms, which is unsubstituted, mono- or poly-substituted by F, Cl, Br, I, —CN or —OH, and in which one or more non-adjacent CH₂ groups are optionally replaced, in each case independently from one another, by —O—, —S—, —NH—, —NR⁰—, —SiR⁰R⁰⁰—, —CO—, —COO—, OCO—, —OCO—O, —S—CO—, —CO—S—, —CH=CH— or —C≡C— in such a manner that 0 and/or S atoms are not linked directly to one another.

Especially preferred aryl and heteroaryl groups are phenyl, fluorinated phenyl, pyridine, pyrimidine, biphenyl, naphthalene, thiophene, fluorinated thiophene, benzo[1,2-b: 4,5-b']dithiophene, thiazole and oxazole, all of which are unsubstituted, mono- or polysubstituted with L as defined above.

If one of $R^1$ to $R^8$ is an alkyl or alkoxy radical, i.e. where the terminal CH₂ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

Oxaalkyl, i.e. where one CH₂ group is replaced by —O—, is preferably straight-chain 2-oxapropyl(=methoxymethyl), 2-(=ethoxymethyl) or 3-oxabutyl(=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

Fluoroalkyl or fluorinated alkyl or alkoxy is preferably straight chain $(O)C_iF_{2i+1}$, wherein i is an integer from 1 to 20, in particular from 1 to 15, very preferably $(O)CF_3$, $(O)C_2F_5$, $(O)C_3F_7$, $(O)C_4F_9$, $(O)C_5F_{11}$, $(O)C_6F_{13}$, $(O)C_7F_{15}$ or $(O)C_8F_{17}$, most preferably $(O)C_6F_{13}$.

Halogen is preferably F, Br or Cl.

Hetero atoms are preferably selected from N, O and S.

The polymerisable or reactive group P is preferably selected from $CH_2=CW^1—COO—$,

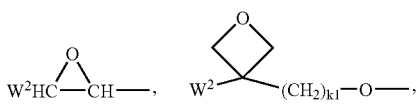

$CH_2$=$CW^2$—$(O)_{k1}$—, $CH_3$—CH=CH—O—, ($CH_2$=CH)$_2$CH—OCO—, ($CH_2$=CH—$CH_2$)$_2$CH—OCO—, ($CH_2$=CH)$_2$CH—O—, ($CH_2$=CH—$CH_2$)$_2$N—, ($CH_2$=CH—$CH_2$)$_2$N—CO—, HO—$CW^2W^3$—, HS—$CW^2W^3$—, $HW^2$N—, HO—$CW^2W^3$—NH—, $CH_2$=$CW^1$—CO—NH—, $CH_2$=CH—(COO)$_{k1}$-Phe-(O)$_{k2}$—, Phe-CH=CH—, HOOC—, OCN—, and $W^4W^5W^6$Si—, with $W^1$ being H, Cl, CN, phenyl or alkyl with 1 to 5 C-atoms, in particular H, Cl or $CH_3$, $W^2$ and $W^3$ being independently of each other H or alkyl with 1 to 5 C-atoms, in particular methyl, ethyl or n-propyl, $W^4$, $W^5$ and $W^6$ being independently of each other Cl, oxaalkyl or oxacarbonylalkyl with 1 to 5 C-atoms, Phe being 1,4-phenylene that is optionally substituted by one or more groups $R^1$ as defined above, and $k_1$ and $k_2$ being independently of each other 0 or 1.

Especially preferred groups P are $CH_2$=CH—COO—, $CH_2$=C($CH_3$)—COO—, $CH_2$=CH—, $CH_2$=CH—O—, ($CH_2$=CH)$_2$CH—OCO—, ($CH_2$=CH)$_2$CH—O—, ($CH_2$=CH—$CH_2$)$_2$N—, ($CH_2$=CH—$CH_2$)$_2$N—CO— and

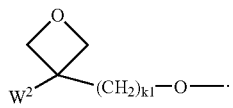

Very preferred are acrylate and oxetane groups. Oxetanes produce less shrinkage upon polymerisation (cross-linking), which results in less stress development within films, leading to higher retention of ordering and fewer defects. Oxetane cross-linking also requires cationic initiator, which unlike free radical initiator is inert to oxygen.

As for the spacer group Sp all groups can be used that are known for this purpose to the skilled in the art. The spacer group Sp is preferably of formula Sp'-X, such that P-Sp- is P-Sp'-X—, wherein Sp' is alkylene with up to 20 C atoms which may be unsubstituted, mono- or poly-substituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X is —O—, —S—, —CO—, —COO—, —OCO—, —O—COO—, —CO—$NR^0$—, —$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^0$—, —$CX^1$=$CX^2$—, —C≡C—, —CH=CH—COO—, —OCO—CH=CH— or a single bond, and $X^1$ and $X^2$ are each, independently of each other, H, F, Cl or CN, and $R^0$ and $R^{00}$ have one of the meanings given above.

X is preferably —O—, —S—, —$OCH_2$—, —$CH_2O$—, —$SCH_2$—, —$CH_2S$—, —$CF_2O$—, —$OCF_2$—, —$CF_2S$—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CX^1$=$CX^2$—, —C≡C— or a single bond, in particular —O—, —S—, —C≡C—, —$CX^1$=$CX^2$— or a single bond, very preferably a group that is able to from a conjugated system, such as —C≡C— or —$CX^1$=$CX^2$—, or a single bond.

Typical groups Sp' are, for example, —$(CH_2)_p$—, —$(CH_2CH_2O)_q$—$CH_2CH_2$—, —$CH_2CH_2$—S—$CH_2CH_2$— or —$CH_2CH_2$—NH—$CH_2CH_2$— or —$(SiR^0R^{00}$—O$)_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene, for example.

Further preferred are compounds with one or two groups P-Sp- wherein Sp is a single bond.

In case of compounds with two groups P-Sp, each of the two polymerisable groups P and the two spacer groups Sp can be identical or different.

SCLCPs (side chain liquid crystal polymers) obtained from the inventive compounds or mixtures by polymerisation or copolymerisation have a backbone that is formed by the polymerisable group P.

The mono-, oligo- and polymers of the present invention can be synthesized according to or in analogy to known methods. Some preferred methods are described in the reaction schemes below (wherein R has one of the meanings of $R^1$ and Ar has the meanings given above).

Materials of formula I1, wherein m is 2 and Ar is substituted arylene can occur with 3 different regioregularities with respect to the substituent at the arylene group; head-to-head; tail-to-tail and head-to-tail, like for example the compounds of formula Ia, Ib and Ic. Two general strategies to these polymers are considered, co-polymerisation of two different monomers and polymerisation of a pre-formed monomer.

Co-Polymerisation

This approach is shown in Scheme 1 below and is most convenient for the synthesis of head-to-head (5) and tail-to-tail (6) polymers. The Suzuki reaction between an aryl diboronic ester or acid and an aryl dibromide is a well established route to conjugated co-polymers. The key monomer 2,7-bis(4,4,5,5-tetramethyl-1,3,2-dioxaborolan-2-yl)-fluorene (8) is synthesised from commercially available 2,7-dibromofluorene and bis(pinacolato)diboron using a palladium catalysed boronation reaction in good yield [see T.

Ishiyama et al, Tetrahedron, 2001, 57, p.9813]. This is reacted with an aryldibromide such as 5,5'-dibromo-3,3'-dialkyl-2,2'-bithiophene (9) or 5,5'-dibromo-4,4"-dialkyl-2,2'-bithiophene (10) [see Bin Liu et al., Macromolecules, 2000, 33, p.8945] in the presence of a base and palladium catalyst to afford polymer 5 or 6.

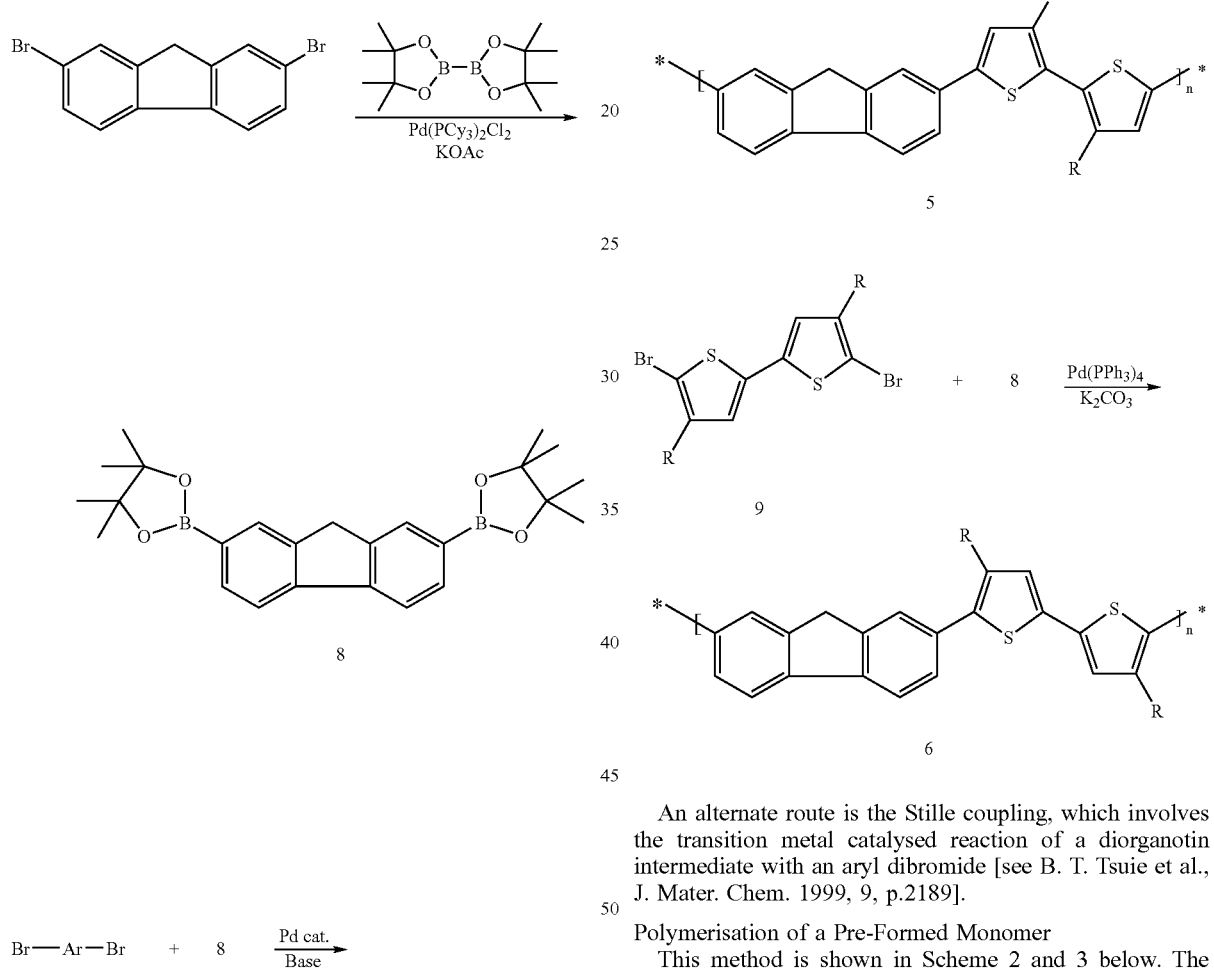

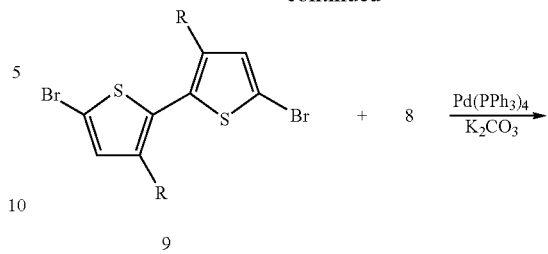

An alternate route is the Stille coupling, which involves the transition metal catalysed reaction of a diorganotin intermediate with an aryl dibromide [see B. T. Tsuie et al., J. Mater. Chem. 1999, 9, p.2189].

Polymerisation of a Pre-Formed Monomer

This method is shown in Scheme 2 and 3 below. The synthesis of the starting monomer can be accomplished by a variety of methods utilising cross-coupling chemistry. For monomers 11 and 12, leading to tail-to-tail and head-to-head polymers respectively, a Suzuki methodology coupling is utilised. Therefore 2,7-bis(4,4,5,5-tetramethyl-1,3,2-dioxaborolan-2-yl)-fluorene (8) is reacted with two equivalents of 2-bromo-3-alkylthiophene or 2-bromo-4-alkylthiophene to afford the monomers. Since both monomers are centrosymmetric, control of the regioregularity of the polymer is not important. Polymerisation can occur directly via oxidative coupling using iron (III) chloride, or the monomers can be further derivatised to the dibromo derivatives and polymerised by transition metal catalysed cross-coupling reactions as shown in Scheme 3 [see T. Yamamoto, J. Organometallic Chemistry, 2002, 653, p.195].

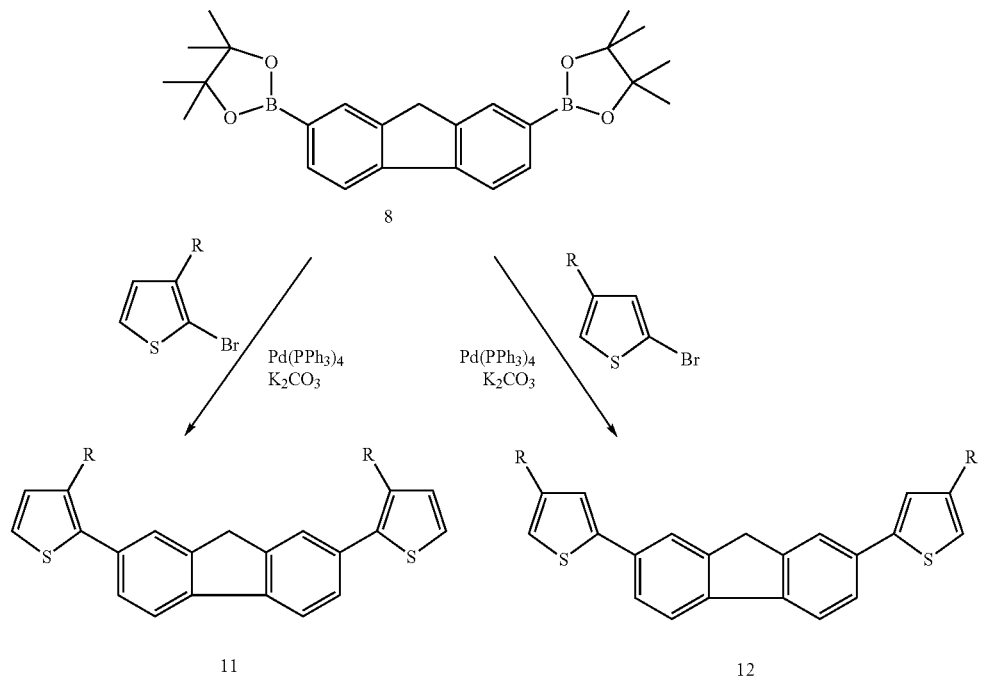

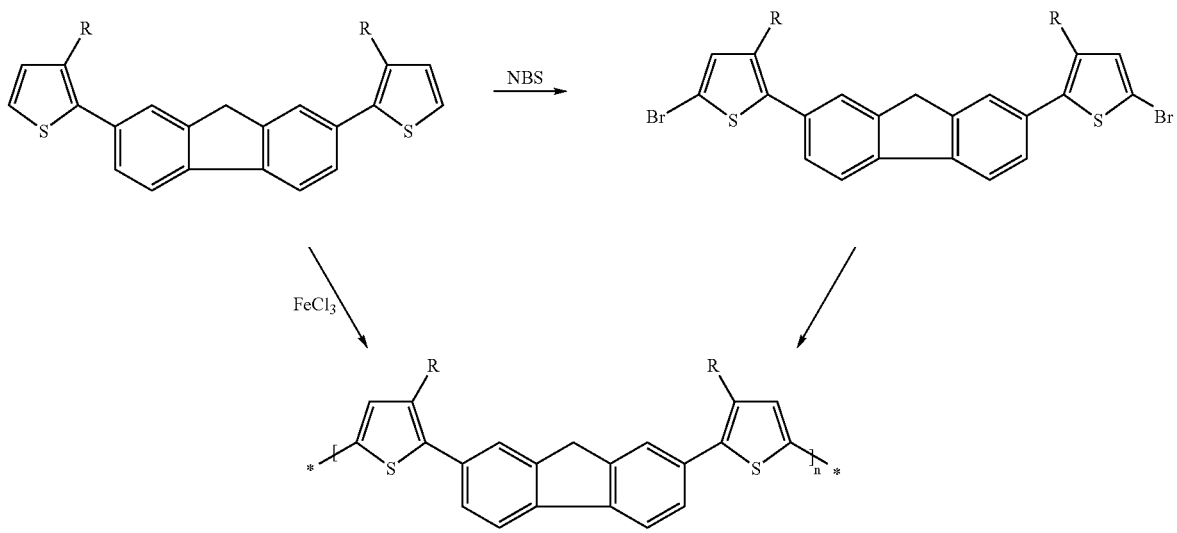

The formation of the regioregular head-to-tail polymer (7) is shown in Schemes 4 and 5 below. The monomer is synthesised in two sequential cross-coupling steps. 2-Bromo-7-iodofluorene is readily synthesised from 2-bromofluorene by iodination with iodobenzene(diacetate) and iodine. Suzuki coupling with the boronic ester of 3-alkylthiophene-2-boronate occurs at the more reactive iodo substituent [see G. Bidan et al., Chem. Mater., 1998, 10: p.1052]. A second Suzuki coupling with sodium 4-alkylthiophene-2-boronate affords the key monomer 13 (Scheme 4) [see T. Kirschbaum et al., J. Chem. Soc., Perkin Trans. 1, 2000, p.1211]. Monomer 13 is selectively monobrominated at the position ortho to the alkyl chain. Polymerisation then occurs by a method analogous to that described by McCullough and co-workers. Treatment with LDA lithiates the unbrominated thiophene ring, metathesis with zinc or magnesium bromide then forms the respective organozinc or organomagnesium reagent 'in situ'. Treatment of this with a transition metal catalyst such as Ni(dppp)Cl$_2$ affords polymer 7 (Scheme 5).

Scheme 4

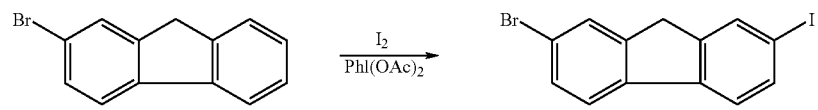

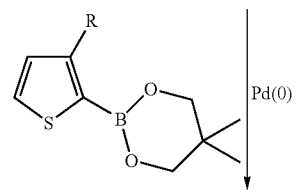

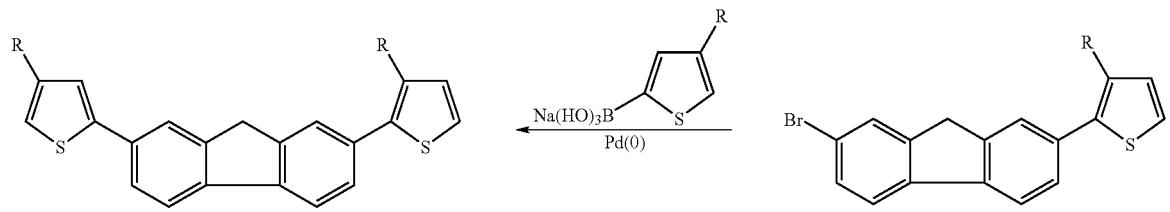

13

Scheme 5

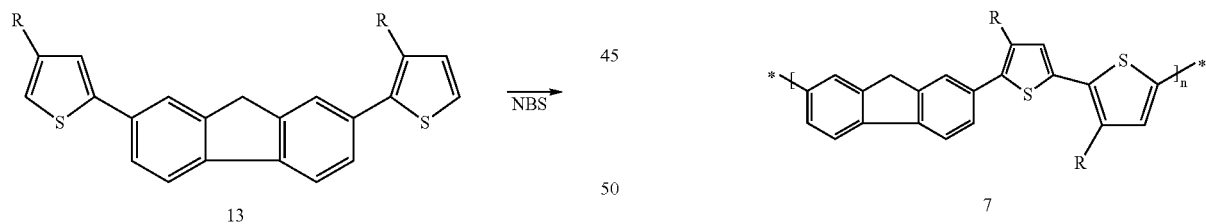

13

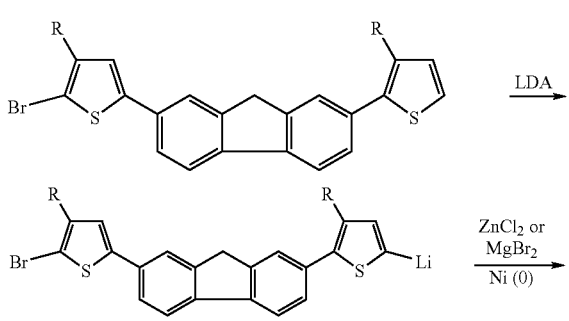

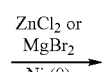

7

Synthesis of Monomers Containing Reactive End-Groups

The synthesis of monomers containing reactive end-groups is outlined is scheme 6, and uitilises a Suzuki cross-coupling reaction between 2,7-bis(4,4,5,5-tetramethyl-1,3,2-dioxaborolan-2-yl)-fluorene (8) and an iodothiophene. The iodothiophene is synthesised in 3 steps from commercially available 2-hydroxymethylthiophene.

Scheme 6

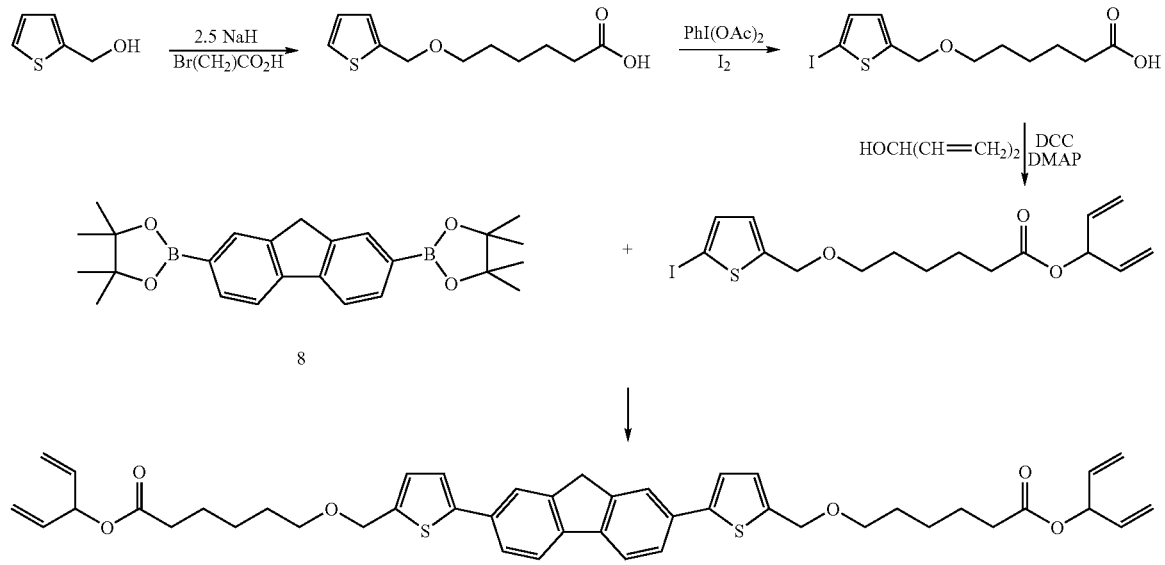

A further aspect of the invention relates to both the oxidised and reduced form of the compounds and materials according to this invention. Either loss or gain of electrons results in formation of a highly delocalised ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)(SbF_6^-)$, $(NO_2^+)(SbCl_6^-)$, $(NO_2^+)(BF_4^-)$, $AgClO_4$, $H_2IrCl_6$, $La(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds and materials of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

A preferred embodiment of the present invention relates to mono-, oligo- and polymers of formula I and its preferred subformulae that are mesogenic or liquid crystalline, and very preferably comprise one or more polymerisable groups. Very preferred materials of this type are monomers and oligomers of formula I and its preferred subformulae wherein n is an integer from 1 to 15 and $R^7$ and/or $R^8$ denote P-Sp-.

These materials are particularly useful as semiconductors or charge transport materials, as they can be aligned into uniform highly ordered orientation in their liquid crystal phase by known techniques, thus exhibiting a higher degree of order that leads to particularly high charge carrier mobility. The highly ordered liquid crystal state can be fixed by in situ polymerisation or crosslinking via the groups P to yield polymer films with high charge carrier mobility and high thermal, mechanical and chemical stability.

For example, if a device is made from a polymerisable liquid crystal material by polymerisation in situ, the liquid crystal material preferably comprises one or more mono- or oligomers of formula I and its preferred subformulae wherein one or both of $R^7$ and $R8^6$ denote P-Sp-. If a liquid crystal polymer is preapred first, for example by polymerisation in solution, and the isolated polymer is used to make the device, the polymer is preferably made from a liquid crystal material comprising one or more mono- or oligomers of formula I and its preferred subformulae wherein one of $R^7$ and $R^8$ denotes P-Sp-.

It is also possible to copolymerise the polymerisable mono-, oligo- and polymers according to the present invention with other polymerisable mesogenic or liquid crystal monomers that are known from prior art, in order to induce or enhance liquid crystal phase behaviour.

Thus, another aspect of the invention relates to a polymerisable liquid crystal material comprising one or more mono-, oligo- or polymers of the present invention as described above and below comprising at least one polymerisable group, and optionally comprising one or more further polymerisable compounds, wherein at least one of the polymerisable mono-, oligo- and polymers of the present invention and/or the further polymerisable compounds is mesogenic or liquid crystalline.

Particularly preferred are liquid crystal materials having a nematic and/or smectic phase. For FET applications smectic materials are especially preferred. For OLED applications nematic or smectic materials are especially preferred.

Another aspect of the present invention relates to an anisotropic polymer film with charge transport properties obtainable from a polymerisable liquid crystal material as defined above that is aligned in its liquid crystal phase into macroscopically uniform orientation and polymerised or crosslinked to fix the oriented state.

Preferably polymerisation is carried out as in-situ polymerisation of a coated layer of the material, preferably during fabrication of the electronic or optical device comprising the inventive semiconductor material. In case of liquid crystal materials, these are preferably aligned in their liquid crystal state into homeotropic orientation prior to polymerisation, where the conjugated pi-electron systems are orthogonal to the direction of charge transport. This ensures that the intermolecular distances are minimised and hence then energy required to transport charge between molecules is minimised. The molecules are then polymerised or crosslinked to fix the uniform orientation of the liquid crystal state. Alignment and curing are carried out in the liquid crystal phase or mesophase of the material. This technique is known in the art and is generally described for example in D. J. Broer, et al., Angew. Makromol. Chem. 183, (1990), 45–66.

Alignment of the liquid crystal material can be achieved for example by treatment of the substrate onto which the material is coated, by shearing the material during or after coating, by application of a magnetic or electric field to the coated material, or by the addition of surface-active compounds to the liquid crystal material. Reviews of alignment techniques are given for example by I. Sage in "Thermotropic Liquid Crystals", edited by G. W. Gray, John Wiley & Sons, 1987, pages 75–77, and by T. Uchida and H. Seki in "Liquid Crystals-Applications and Uses Vol. 3", edited by B. Bahadur, World Scientific Publishing, Singapore 1992, pages 1–63. A review of alignment materials and techniques is given by J. Cognard, Mol. Cryst. Liq. Cryst. 78, Supplement 1 (1981), pages 1–77.

Polymerisation takes place by exposure to heat or actinic radiation. Actinic radiation means irradiation with light, like UV light, IR light or visible light, irradiation with X-rays or gamma rays or irradiation with high energy particles, such as ions or electrons. Preferably polymerisation is carried out by UV irradiation at a non-absorbing wavelength. As a source for actinic radiation for example a single UV lamp or a set of UV lamps can be used. When using a high lamp power the curing time can be reduced. Another possible source for actinic radiation is a laser, like, e.g. a UV laser, an IR laser or a visible laser.

Polymerisation is preferably carried out in the presence of an initiator absorbing at the wavelength of the actinic radiation. For example, when polymerising by means of UV light, a photoinitiator can be used that decomposes under UV irradiation to produce free radicals or ions that start the polymerisation reaction. When curing polymerisable materials with acrylate or methacrylate groups, preferably a radical photoinitiator is used, when curing polymerisable materials with vinyl, epoxide and oxetane groups, preferably a cationic photoinitiator is used. It is also possible to use a polymerisation initiator that decomposes when heated to produce free radicals or ions that start the polymerisation. As a photoinitiator for radical polymerisation for example the commercially available Irgacure 651, Irgacure 184, Darocure 1173 or Darocure 4205 (all from Ciba Geigy AG) can be used, whereas in case of cationic photopolymerisation the commercially available UVI 6974 (Union Carbide) can be used.

The polymerisable material can additionally comprise one or more other suitable components such as, for example, catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colourants, dyes or pigments.

Mono-, oligo- and polymers comprising one or more groups P-Sp- can also be copolymerised with polymerisable mesogenic compounds to induce or enhance liquid crystal phase behaviour. Polymerisable mesogenic compounds that are suitable as comonomers are known in prior art and disclosed for example in WO 93/22397; EP 0,261,712; DE 195,04,224; WO 95/22586 and WO 97/00600.

Another aspect of the invention relates to a liquid crystal side chain polymer (SCLCP) obtained from a polymerisable liquid crystal material as defined above by polymerisation or polymeranaloguous reaction. Particularly preferred are SCLCPs obtained from one or more monomers of formula I1 and its preferred subformulae wherein one or both of $R^7$ and $R^8$ are a polymerisable or reactive group, or from a polymerisable mixture comprising one or more of said monomers.

Another aspect of the invention relates to an SCLCP obtained from one or more monomers of formula I1 and its preferred subformulae wherein one or both of $R^7$ and $R^8$ are a polymerisable group, or from a polymerisable liquid crystal mixture as defined above, by copolymerisation or polymeranaloguous reaction together with one or more additional mesogenic or non-mesogenic comonomers.

Side chain liquid crystal polymers or copolymers (SCLCPs), in which the semiconducting component is located as a pendant group, separated from a flexible backbone by an aliphatic spacer group, offer the possibility to obtain a highly ordered lamellar like morphology. This structure consists of closely packed conjugated aromatic mesogens, in which very close (typically <4 Å) pi-pi stacking can occur. This stacking allows intermolecular charge transport to occur more easily, leading to high charge carrier mobilities. SCLCPs are advantageous for specific applications as they can be readily synthesized before processing and then e.g. be processed from solution in an organic solvent. If SCLCPs are used in solutions, they can orient spontaneously when coated onto an appropriate surface and when at their mesophase temperature, which can result in large area, highly ordered domains.

SCLCPs can be prepared from the polymerisable compounds or mixtures according to the invention by the methods described above, or by conventional polymerisation techniques which are known to those skilled in the art, including for example radicalic, anionic or cationic chain polymerisation, polyaddition or polycondensation. Polymerisation can be carried out for example as polymerisation in solution, without the need of coating and prior alignment, or polymerisation in situ.

It is also possible to form SCLCPs by grafting compounds according to the invention with a suitable reactive group, or mixtures thereof, to presynthesized isotropic or anisotropic polymer backbones in a polymeranaloguous reaction. For example, compounds with a terminal hydroxy group can be attached to polymer backbones with lateral carboxylic acid or ester groups, compounds with terminal isocyanate groups can be added to backbones with free hydroxy groups, compounds with terminal vinyl or vinyloxy groups can be added, e.g., to polysiloxane backbones with Si—H groups.

It is also possible to form SCLCPs by copolymerisation or polymeranaloguous reaction from the inventive compounds together with conventional mesogenic or non mesogenic comonomers. Suitable comonomers are known to those skilled in the art. In principle it is possible to use all conventional comonomers known in the art that carry a reactive or polymerisable group capable of undergoing the desired polymer-forming reaction, like for example a polymerisable or reactive group P as defined above. Typical mesogenic comonomers are for example those mentioned in WO 93/22397, EP 0 261 712, DE 195 04 224, WO 95/22586, WO 97/00600 and GB 2 351 734. Typical non mesogenic comonomers are for example alkyl mono- or diacrylates or alkyl mono- or dimethacrylates with alkyl groups of 1 to 20 C atoms, like methyl acrylate or methyl methacrylate, trimethylpropane trimethacrylate or pentaerythritol tetraacrylate.

The mono-, oligo- and polymers of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

Especially the oligomers and polymers according to the invention show advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated derivatives.

The materials of the present invention are useful as optical, electronic and semiconductor materials, in particular as charge transport materials in field effect transistors (FETs), as photovoltaics or sensor materials, for electrophotographic recording, and for other semiconductor applications. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with money value, like stamps, tickets, shares, cheques etc.

Alternatively, the mono-, oligo- and polymers according to the invention may be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111–112, 2000, 31–34, Alcala, J. Appl. Phys., 88, 2000, 7124–7128 and the literature cited therein.

According to another use, the inventive compounds, materials or films, especially those which show photoluminescent properties, may be employed as materials of light sources, e.g., of display devices such as described in EP 0 889 350 A1 or by C. Weder et al., Science, 279, 1998, 835–837.

According to another use, the inventive compounds, materials or films can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

The invention is further explained by the following examples.

In the foregoing and in the following examples, all temperatures are set forth uncorrected in degrees Celsius; and, unless otherwise indicated, all parts and percentages are by weight.

The entire disclosure of all applications, patents and publications, cited above and below, and of corresponding European Application No. 03004925.8, filed Mar. 7, 2003, is hereby incorporated by reference.

EXAMPLE 1

Poly(3,3'-dihexyl-2,2'-bithiophene-alt-fluorene) of formula IIa, wherein $R^1$ is n-hexyl, was prepared according to Scheme 1.

2,7-Bis(4,4,5,5-tetramethyl-1,3,2-dioxaborolan-2-yl)-fluorene (8) 2,7-Dibromofluorene (5.74 g, 17.73 mmol), bis(pinacolato)diboron (11.26 g, 44.33 mmol), potassium acetate (5.22 g, 53.20 mmol) and dichlorobis(tricyclohexylphosphine)palladium(II) (0.78 g, 0.61 mmol) were charged in a 3-necked flask. Anhydrous 1,4-dioxane (150 mL) was added and the reaction mixture was stirred at 100° C. for 24 h. The reaction mixture was quenched with water (100 mL) and extracted into chloroform (2×200 mL). The combined extracts were washed with water (100 mL), dried over sodium sulfate and concentrated in vacuo. Purifcation by column chromatography (eluent: dichloromethane) yielded the product as a white solid (5.67 g, 13.56 mmol, 76%). NMR shows the expected signals. $M^+$=418.

3,3'-Dihexyl-2,2'-bithiophene was prepared according to the method of P. Bäuerle, F. Pfau, H. Schlupp, F. Würthner, K. U. Gaudl, M. B. Caro, P. Fischer, *J. Chem. Soc., Perkin Trans.* 2, 1993, 489.

5,5'-Dibromo-3,3'-Dihexyl-2,2'-bithiophene (9) (R=$C_6H_{13}$) was prepared according to the method of B. Liu, W. L. Yu, Y. H. Lai, W. Huang, *Macromolecules*, 2000, 33, 8945.

4,4'-Didodecyl-2,2'-bithiophene 2.5 M BuLi in hexanes (18 mL, 45.00 mmol) and anhydrous TMEDA (6.8 mL, 45.06 mmol) were added dropwise to a solution of 3-dodecylthiophene (10.00 g, 39.61 mmol) in anhydrous THF (40 mL) at RT under nitrogen. The reaction mixture was stirred at reflux for 1 h and then cooled down to −78° C. Copper(II) chloride (6.39 g, 47.53 mmol) was added in one portion and the reaction mixture was allowed to warm to RT stirring for 18 h. The reaction mixture was then stirred at reflux for 6 h. The reaction mixture was acidified with dilute hydrochloric acid and extracted into diethyl ether (2×200 mL). The combined extracts were washed with water (100 mL), dried over anhydrous sodium sulfate and concentrated in vacuo. Column chromatography (eluent: petroleum ether 40–60) followed by recrystallisation from diethyl ether at −78° C. yielded a yellow solid (3.78 g, 7.52 mmol, 38%): $\delta_H$(CDCl$_3$, 300 MHz) 6.97 (2H, s), 6.76 (2H, s), 2.56 (4H, t, $^3J_{HH}$=8.0 Hz), 1.61 (4H, m), 1.20–1.40 (36H, br), 0.88 (6H, t, $^3J_{HH}$=7.0 Hz); $\delta_C$(CDCl$_3$, 75 MHz) 144.0, 137.4, 124.8, 118.7, 32.0, 30.6, 30.4, 29.7, 29.6, 29.5, 29.4, 29.3, 22.7, 14.2.

5,5'-Dibromo-4,4'-didodecyl-2,2'-bithiophene (10) (R=$C_{12}H_{25}$) NBS (0.53 g, 2.98 mmol) was added in portions to 4,4'-didodecyl-2,2'-bithiophene (0.75 g, 1.49 mmol) in chloroform (5 mL) and glacial acetic acid (5 mL) under nitrogen. The reaction mixture was stirred overnight before being poured onto water and extracted into DCM (2×250 mL). The combined extracts were washed with water (2×100 mL), dried over anhydrous sodium sulfate, and concentrated in vacuo. Column chromatography (eluent: petroleum ether 40–60) yielded the product as a yellow solid (0.99 g, 1.49 mmol, 100%): $\delta_H$(CDCl$_3$, 300 MHz) 6.77 (2H, s), 2.51 (4H, t, $^3J_{HH}$=8.0 Hz), 1.57 (4H, m), 1.20–1.40 (36H, br), 0.88 (6H, t, $^3J_{HH}$=7.0 Hz); $\delta_C$(CDCl$_3$, 75 MHz) 142.8, 136.0, 124.3, 107.0, 31.8, 29.5, 29.4, 29.2, 29.0, 22.6, 14.0.

Poly(3,3'-dihexyl-2,2'-bithiophene-alt-fluorene) (5) (R=$C_6H_{13}$) A 3-necked flask was charged with 2,7-bis(4,4,5,5-tetramethyl-1,3,2-dioxaborolan-2-yl)-fluorene (8) (1.28 g, 3.07 mmol), 5,5'-dibromo-3,3'-dihexyl-2,2'-bithiophene (1.51 g, 3.07 mmol), tetrakis(triphenylphosphine)palladium(0) (34 mg, 0.03 mmol), Aliquat 336 (0.50 g) and toluene (30 mL) under nitrogen. A 2 M aqueous solution of sodium carbonate (5 mL) was added and the reaction mixture was stirred at reflux for 22 h. The reaction mixture was precipitated into methanol (500 mL). The polymer was collected and washed with water followed by methanol. After drying, the polymer was dissolved in hot chloroform and reprecipitated from methanol (500 mL). The polymer was collected and washed with refluxing methanol (via Soxhlet extraction) for 18 h followed by refluxing iso-hexane (via Soxhlet extraction) for 6 h. The polymer was then redissolved in hot chloroform and reprecipitated from methanol (400 mL). The polymer was collected and dried under vacuum to yield the polymer as a lime green solid (1.39 g, 2.79 mmol, 91%): m.p. 122° C. (Tg); 199 (I). $\delta_H$(CDCl$_3$, 500 MHz) 7.80 (2H, s), 7.77 (2H, d, $^3J_{HH}$=8.0 Hz), 7.66 (2H, d, $^3J_{HH}$=8.0 Hz), 7.27 (2H, s), 3.99 (2H, s), 2.62 (4H, br), 1.65 (4H, br), 1.30–1.35 (12H, br), 0.88 (6H, br). $M_w$=52,000, $M_n$=26,000; abs $\lambda_{max}$ (CDCl$_3$) 406 nm.

EXAMPLE 2

Poly(4,4'-didodecyl-2,2'-bithiophene-a/t-fluorene) of formula IIb, wherein $R^1$ is n-dodecyl, was prepared according to Scheme 1.

Poly(4,4'-didodecyl-2,2'-bithiophene-alt-fluorene) (6) (R=$C_{12}H_{25}$) A 3-necked flask was charged with 2,7-bis(4,4,5,5-tetramethyl-1,3,2-dioxaborolan-2-yl)-fluorene (8) (0.60 g, 1.44 mmol), 5,5'-dibromo-4,4'-didodecyl-2,2'-bithiophene (0.95 g, 1.44 mmol), tetrakis(triphenylphosphine)palladium(0) (34 mg, 0.03 mmol), Aliquat 336 (0.25 g) and toluene (20 mL) under nitrogen. A 2 M aqueous solution of sodium carbonate (2.5 mL) was added and the reaction mixture was stirred at reflux for 48 h. The reaction mixture was precipitated into methanol (400 mL). The polymer was collected and washed with water followed by methanol. After drying, the polymer was washed with methanol (via Soxhlet extraction) for 16 h followed by iso-hexane (via Soxhlet extraction) for 6 h. The polymer was then redissolved in hot chloroform and reprecipitated from methanol (400 mL). The polymer was collected and dried under vacuum to yield the polymer as a green solid (0.75 g, 1.12 mmol, 78%): m.p. 130° (Tg), 160° C. (N), 360° C. (dec.) $\delta_H$(CDCl$_3$, 300 MHz) 7.84 (2H, d, $^3J_{HH}$=8.0 Hz), 7.66 (2H, s), 7.51 (2H, d, $^3J_{HH}$=8.0 Hz), 7.11 (2H, s), 4.02 (2H, s), 2.71 (4H, br), 1.67 (4H, br), 0.95–1.40 (36H, br), 0.87 (6H, br). $M_w$=137,000, $M_n$=32,000 (bimodal); abs $\lambda_{max}$ (CDCl$_3$) 405 nm.

EXAMPLE 3

Poly(9-((bishexyl-methylene)fluorene-alt-fluorene)) of formula If, wherein $R^1$ is n-hexyl, was prepared according to Scheme 1.

Poly(9-((bishexyl-methylene)fluorene-alt-fluorene)
A 3-necked flask was charged with 2,7-bis(4,4,5,5-tetramethyl-1,3,2-dioxaborolan-2-yl)-fluorene (8) (0.622 g, 1.49 mmol), 2,7-dibromo-9-(bis-hexyl-methylene)fluorene (0.75 g, 1.49 mmol), tetrakis(triphenylphosphine)palladium(0) (17 mg, 0.015 mmol), Aliquat 336 (0.25 g) and toluene (20 mL) under nitrogen. A 2 M aqueous solution of sodium carbonate (2.5 mL) was added and the reaction mixture was stirred at reflux for 22 h. Bromobenzene (0.12 g, 0.75 mmol)

was added and the solution was stirred for 1 h at reflux, then bezene boronic acid was added and the solution stirred for a further 1 h at reflux. The reaction mixture was cooled, precipitated into methanol (400 mL). The polymer was collected and washed with water followed by methanol. After drying, the polymer was washed with methanol (via Soxhlet extraction) for 24 h followed by iso-hexane (via Soxhlet extraction) for 24 h to afford the polymer as a green solid (0.73 g) of poor solubility m.p.>300° C.

EXAMPLE 4

Monomer (4) was prepared according to Scheme 6 as follows.

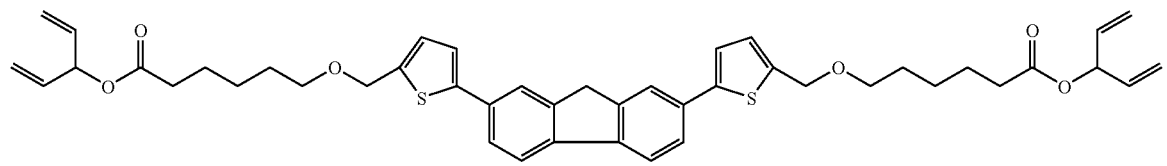

(4)

Tetrakis(triphenylphosphine)palladium(0) (0.05 g) was added to a solution of vinylallyl 6-[5-iodo-(2-thienyl)]methoxyhexanoate (0.84 g, 2.0 mmol) in dry DME (70 ml) with stirring under nitrogen. After 20 min, 5,5'-di(4,4,5,5-tetramethyl[1,3,2]dioxoborolan-2-yl)-2,2'-bithiophene (0.20 g, 0.48 mmol) was added, followed by the addition of cesium fluoride (0.46 g, 3.0 mmol). The reaction mixture was heated at reflux overnight under nitrogen. After cooling, water (50 ml) was added, followed by extraction with ethyl acetate (3×50 ml). The extracts were washed with water (50 ml) and brine (50 ml), dried ($Na_2SO_4$) and evaporated under reduced pressure. Purification by column chromatography on silica, eluting with petroleum ether/ethyl acetate (from 9:1 to 5:1), gave a yellow solid, which was recystallised from ethyl acetate twice to afford 2 as pale yellow crystals (0.16 g, 44%). $^1$H NMR (300 MHz, $CDCl_3$): δ (ppm) 7.65–7.78 (m, 6H, Ar—H), 7.23 (d, J=3.6 Hz, 2H, Ar—H), 6.98 (d, J=3.6 Hz, 2H, Ar—H), 5.87 (m, 4H, =CH), 5.83 (m, 2H, OCH), 5.28 (m, 8H, =$CH_2$), 4.68 (s, 4H, $OCH_2$), 3.98 (s, 2H, $CH_2$), 3.54 (t, J=8.3 Hz), 2.38 (t, J=7.4 Hz, 4H, CO—$CH_2$), 1.67 (m, 8H, $CH_2$), 1.47 (m, 4H, $CH_2$); $^{13}$C NMR (75 MHz, $CDCl_3$): δ (ppm) 173.0 (2×C=O), 145.5 (2×quat.), 144.5 (2×quat.), 141.13 (2×quat.), 141.10 (2×quat.), 135.5 (4×CH), 133.5 (2×quat.), 127.7 (2×CH), 125.1 (2×CH), 122.8 (2×CH), 122.7 (2×CH), 120.5 (2×CH), 117.8 (4×$CH_2$), 75.2 (2×$CH_2$), 70.3 (2×$CH_2$), 68.0 (2×$CH_2$), 37.3 (2×quat.), 34.9 (2×$CH_2$), 29.8 (2×$CH_2$), 26.1 (2×$CH_2$), 25.2 (2×$CH_2$); MS (m/e): 768 ($M^+$+OH, 100%), 553 (66), 242 (74), 129 (10).

The following phase transitions and liquid crystal phase behaviour were determined by optical microscopy and DSC: K-30-$S_x$-146-I were $S_x$ is an undetermined highly order smectic phase.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A mono-, oligo- or polymeric compound comprising at least one 9-H,H-fluorene group and at least one arylene or heteroarylene group.

2. A compound according to claim 1, wherein said compound has a degree of polymerisation of 10 to 5000.

3. A compound according to claim 1, wherein said compound contains one or more identical or different recurring units selected of formula I

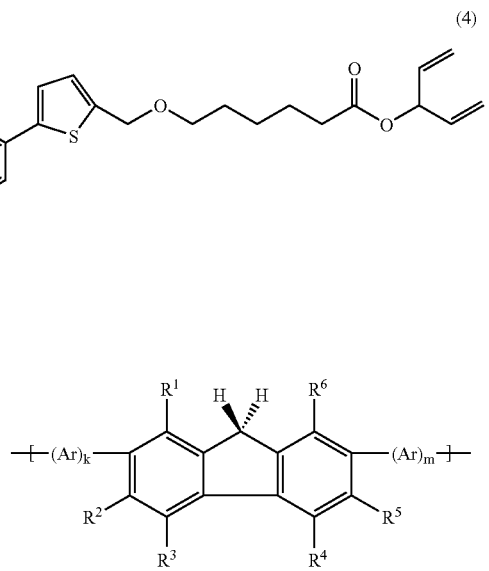

I wherein $R^1$ to $R^6$ are independently of each other H, halogen, straight chain, branched or cyclic alkyl with 1 to 20 C-atoms which is unsubstituted, or mono- or poly-substituted by F, Cl, Br, I and/or CN and wherein one or more non-adjacent $CH_2$ groups are, in each case independently from one another, optionally replaced by —O—, —S—, —NH—, —$NR^o$—, —$SiR^oR^{oo}$—, —CO—, —COO—, —OCO—, —OCO—O—, —S—CO—, —CO—S—, —CH=CH— or —C≡C— in such a manner that O and/or S atoms are not linked directly to one another, optionally substituted aryl, optionally substituted heteroaryl, or P-Sp-, P is a polymerisable or reactive group, Sp is a spacer group or a single bond, $R^o$ and $R^{oo}$ are independently of each other H or alkyl with 1 to 12 C-atoms, Ar is arylene or heteroarylene group which in each case is unsubstituted or substituted by one or more groups and k and m are independently of each other 0, 1, 2, 3 or 4, with k+m>1.

4. A compound according to claim 3, wherein said compound is of formula I1

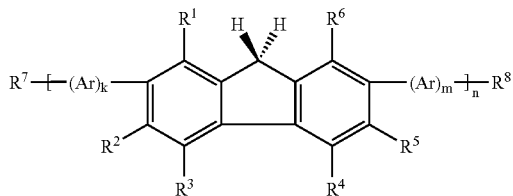

wherein

R$^7$ and R$^8$ are independently of each other H, halogen, Sn(R$^0$)$_3$, or straight chain, branched or cyclic alkyl with 1 to 20 C-atoms which is unsubstituted, or mono- or poly-substituted by F, Cl, Br, I, —CN and/or —OH and wherein one or more non-adjacent CH$_2$ groups are, in each case independently from one another, optionally replaced by —O—, —S—, —NH—, —NR$^0$—, —SiR$^0$R$^{00}$—, —CO—, —COO—, —OCO—, —OCO—O—, —S—CO—, —CO—S—, —OH=CH— or —C≡C— in such a manner that O and/or S atoms are not linked directly to one another, optionally substituted aryl, optionally substituted heteroaryl, or P-Sp, and n is an integer from 1 to 10000, wherein the recurring units may be identical or different.

5. A compound according to claim 4, wherein k is 0 or 1 and m is 1 or 2.

6. A compound according to claim 4, wherein n is an integer from 1 to 15 and one or both of R$^7$ and R$^8$ is P-Sp-.

7. A compound according to claim 5, wherein n is an integer from 1 to 15 and one or both of R$^7$ and R$^8$ is P-Sp-.

8. A compound according to claim 3, wherein said compound has a degree of polymerisation of 10 to 5000.

9. A compound according to claim 3, wherein R$^1$ to R$^6$ are each H.

10. A compound according to claim 3, wherein R$^1$ to R$^6$ are H, C$_1$–C$_{20}$-alkyl that is optionally substituted with one or more fluorine atoms, C$_1$–C$_{20}$-alkenyl, C$_1$–C$_{20}$-alkynyl, C$_1$–C$_{20}$-alkoxy, C$_1$–C$_{20}$-thioether, C$_1$–C$_{20}$-silyl, C$_1$–C$_{20}$-ester, C$_1$–C$_{20}$-amino, C$_1$–C$_{20}$-fluoroalkyl, (CH$_2$CH$_2$O)$_m$C$_l$H$_{2l+1}$, with m being 1 to 6 and l being 1, 2, or 3, optionally substituted aryl, or optionally substituted heteroaryl.

11. A compound according to claim 3, wherein said compound is selected from the following formulae

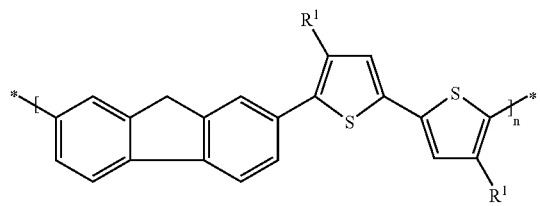

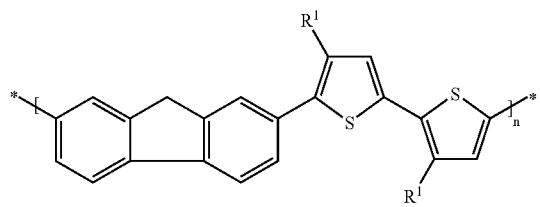

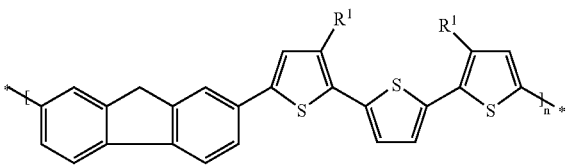

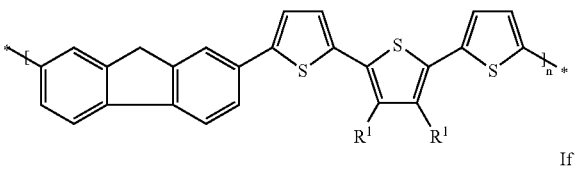

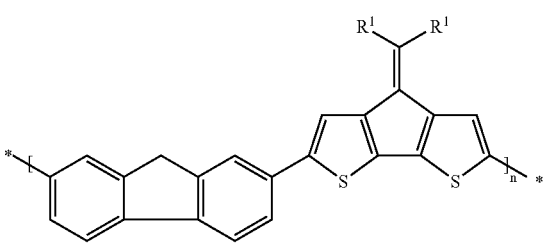

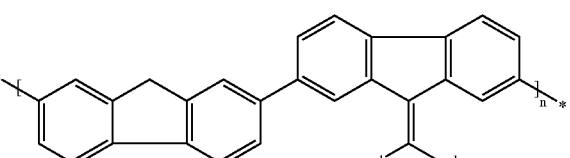

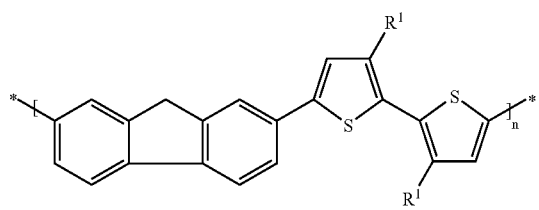

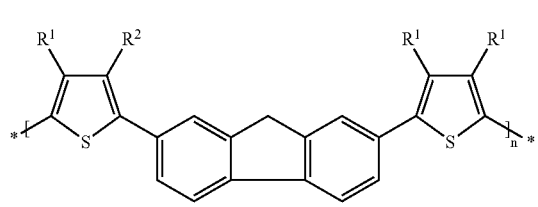

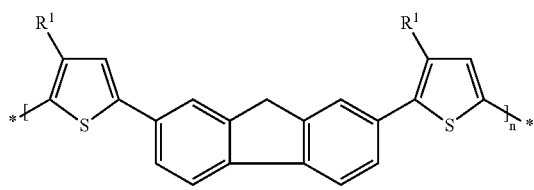
Ii

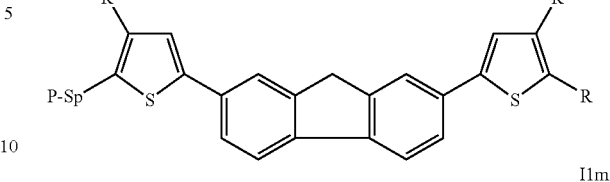
IIk

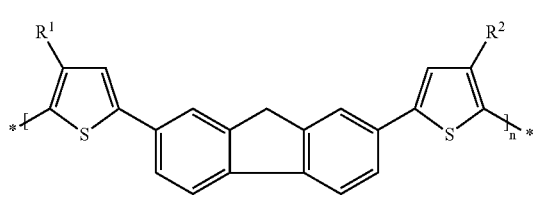
Ik

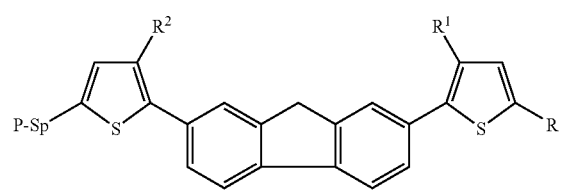
IIm

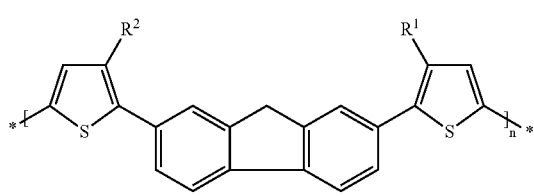
Im wherein n is 1 to 10,000.

12. A monomeric compound according to claim 3, wherein said compound is selected from the following formulae

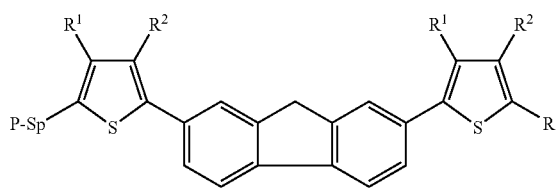
IIh

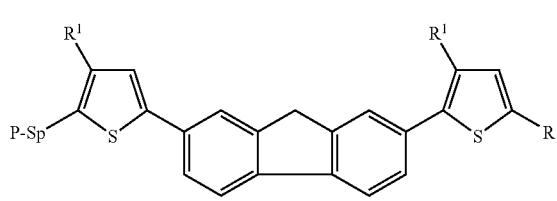
IIi1

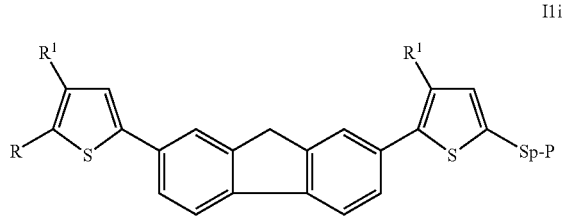
IIi2 wherein R is H, halogen, Sn(R⁰)₃, or straight chain, branched or cyclic alkyl with 1 to 20 C-atoms which is unsubstituted, or mono- or poly-substituted by F, Cl, Br, I, —CN and/or —OH and wherein one or more non-adjacent CH₂ groups are, in each case independently from one another, optionally replaced by —O—, —S—, —NH—, —NR⁰—, —SiR⁰R⁰⁰—, —CO—, —COO—, —OCO—, —OCO—O—, —S—CO—, —CO—S—, —CH=CH— or —C≡C— in such a manner that O and/or S atoms are not linked directly to one another, optionally substituted aryl, optionally substituted heteroaryl, or P-Sp.

13. A monomeric compound according to claim 12, wherein R is P-Sp.

14. A compound according to claim 4, wherein R⁷, R⁸ and R are each selected from H, halogen, Sn(R⁰)₃, CH₂Cl, COH, CH=CH₂, SiR⁰R⁰⁰, optionally substituted aryl, or heteroaryl.

15. A compound according to claim 2, wherein Ar is selected from phenyl, fluorinated phenyl, pyridine, pyrimidine, biphenyl, naphthalene, thiophene, fluorinated thiophene, benzo[1,2-b:4,5-b']dithiophene, cyclopenta[2,1-b:3,4-b']dithiophene, 9-alkylidenefluorene, 9-H,H-fluorene, thiazole and oxazole, which in each case is unsubstituted or mono- or polysubstituted by R¹ or L, and L is F, Cl, Br, or an alkyl, alkoxy, alkylcarbonyl or alkoxycarbonyl group with 1 to 12 C atoms, wherein one or more H atoms are each optionally replaced by F or Cl.

16. A compound according to claim 15, wherein Ar is thiophene-2,5-diyl which is unsubstituted or substituted in 3- or 4-position by R₁.

17. A compound according to claim 3, wherein
P is selected from CH₂=CW¹—COO—,

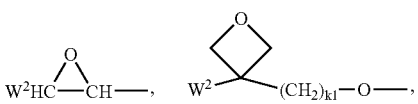

CH₂=CW²—(O)$_{k1}$—,   CH₃—CH=CH—O—,
(CH₂=CH)₂CH—OCO—,   (CH₂=CH—CH₂)₂CH—OCO—,   (CH₂=CH—CH₂)₂CH—O—,   (CH₂=CH—CH₂)₂N—,
(CH₂=CH—CH₂)₂N—CO—,   HO—OW²W³—,

HS—CW²W³—, HW²N—, HO—CW²W³—NH—, CH₂=CW¹—CO—NH—, CH₂=CH—(COO)$_{k1}$-Phe-(O)$_{k2}$—, Phe-CH=OH—, HOOC—, OCN—, and W⁴W⁵W⁶Si—, W1 is H, Cl, CN, phenyl or alkyl with 1 to 5 C-atoms, in particular H, Cl or CH₃, W² and W³ are each independently of each other H or alkyl with 1 to 5 C-atoms, W⁴, W⁵ and W⁶ are each independently of each other Cl, oxaalkyl or oxacarbonylalkyl with 1 to 5 C-atoms, Phe is 1,4-phenylene which is optionally substituted by one or more halogen, straight chain, branched or cyclic alkyl with 1 to 20 C-atoms which is unsubstituted, or mono- or poly-substituted by F, Cl, Br, I and/or CN and wherein one or more non-adjacent CH₂ groups are, in each case independently from one another, optionally replaced by —O—, —S—, —NH—, —NR⁰—, —SiR⁰R⁰⁰—, —CO—, —COO—, —OCO—, —OCO—O—, —S—CO—, —CO—S—, —CH=CH— or —C≡C—in such a manner that O and/or S atoms are not linked directly to one another, optionally substituted aryl, optionally substituted heteroaryl, or P-Sp-, and k₁ and k₂ being independently of each other 0 or 1.

18. A compound according to claim 1, wherein P-Sp- is, in each case, P-Sp'-X—,

Sp' is alkylene with up to 20 C atoms which is unsubstituted, or mono- or poly-substituted by F, Cl, Br, I or CN, and one or more non-adjacent OH₂ groups of said alkylene are optionally replaced, in each case independently from one another, by —O—, —S—, —NH—, —NR⁰—, —SiR⁰R⁰⁰—, —CO—, —COO—, —OCO—, —OCO—O—, —S—CO—, —CO—S—, —CH=CH— or —C≡C— in such a manner that O and/or S atoms are not linked directly to one another, X is —O—, —S—, —CO—, —COO—, —OCO—, —O—COO—, —CO—NR⁰—, NR⁰—CO—, —OCH₂—, —CH₂O—, —SCH₂—, —CH₂S—, —CF₂O—, —OCF₂—, —CF₂S—, —SCF₂—, —CF₂CH₂—, —CH₂CF₂—, —CF₂CF₂—, —CH=N—, —N=CH—, —N=N—, —CH=CR⁰—, —CX¹=CX²—, —C≡C—, —CH=CH—COO—, —OCO—CH=CH— or a single bond, and, X¹ and X² are each, independently of each other, H, F, Cl or CN.

19. A polymerisable liquid crystal material comprising one or more polymerisable compounds according to claim 1, comprising at least one polymerisable group, and optionally comprising one or more further polymerisable compounds, wherein said at least one of the polymerisable compounds and/or said one or more further polymerisable compounds is mesogenic or liquid crystalline.

20. An anisotropic polymer film with charge transport properties obtainable by polymerizing a polymerisable liquid crystal material according to claim 19 that is aligned in its liquid crystal phase into macroscopically uniform orientation and polymerised or crosslinked to fix the oriented state.

21. A side chain liquid crystal polymer obtained by:

polymerisation of one or more mono- or oligomers according to claim 1, or grafting one or more of said mono- or oligomers to a polymer backbone in a polymeranaloguous reaction, in each case, optionally with one or more additional mesogenic or non-mesogenic comonomers.

22. A semiconductor or charge transport material suitable for use in optical, electrooptical or electronic devices, like field effect transistors (FET), for example as components of integrated circuitry, or a thin film transistor (TFT) for flat panel display applications, or a radio frequency identification (RFID) tag, or a semiconducting component for organic light emitting diode (OLED) applications, including both the charge transport and electroluminescent layers in electroluminescent displays or backlights of liquid crystal displays (LCD), comprising a monomeric, oligomeric or polymeric compound according to claim 1.

23. An electroluminescent material, a photovoltaic or sensor device, an electrode material in batteries, a photoconductor, an electrophotographic material like as used in electrophotographic recording, or an alignment layer as used in LCD or OLED devices, comprising a monomeric, oligomeric or polymeric compound according to claim 1.

24. An optical, electrooptical or electronic device, an FET, an integrated circuit (IC), a TFT, an OLED or an alignment layer comprising a monomeric, oligomeric or polymeric compound according to claim 1.

25. A TFT or TFT array for flat panel displays, a radio frequency identification (REID) tag, an electroluminescent display or backlight, comprising a monomeric, oligomeric or polymeric compound according to claim 1.

26. A security marking or device comprising a FET or an RFID tag according to claim 24.

27. A monomeric, oligomeric or polymeric compound according to claim 1, which is oxidatively or reductively doped to form conducting ionic species.

28. A charge injection layer, planarising layer, antistatic film or conducting substrate or pattern for electronic applications or flat panel displays, comprising a monomeric, oligomeric or polymeric compound, a polymerisable material, or a polymer according to claim 27.

* * * * *

UNITED STATES PATENT AND TRADEMARK OFFICE
CERTIFICATE OF CORRECTION

| | | |
|---|---|---|
| PATENT NO. | : 7,126,013 B2 | Page 1 of 1 |
| APPLICATION NO. | : 10/793812 | |
| DATED | : October 24, 2006 | |
| INVENTOR(S) | : Martin Heeney | |

It is certified that error appears in the above-identified patent and that said Letters Patent is hereby corrected as shown below:

Column 28, lines 61-62, reads "groups and" should read -- groups $R^1$, and --
Column 29, line 26, reads "-OH=CH-" should read -- -CH=CH- --
Column 29, line 52, reads "and I being" should read -- and i being --
Column 32, line 25, reads "$OH_2$ groups" should read -- $CH_2$ groups --
Column 32, line 32, reads "P-Sp" should read -- P-Sp— --
Column 32, line 34, reads "P-Sp" should read -- P-Sp— --
Column 32, line 53, reads "by $R_1$." should read -- $R^1$. --
Column 32, line 65, reads "$(CH_2=CH)_2$ CH-OCO-," should read
-- $(CH_2=CH)_2CH-OCO-$, --
Column 32, line 67, reads "$HO-OW^2W^3$-," should read -- $HO-CW^2W^3$-, --
Column 33, line 3, reads "Phe-CH=OH-," should read -- Phe-CH=CH-, --
Column 33, line 5, reads "W1 is H," should read -- $W^1$ is H, --
Column 33, line 29, reads "$OH_2$ groups" should read -- $CH_2$ groups --
Column 33, line 37, reads "$NR°-CO-$," should read -- $-NR°-CO-$, --
Column 33, line 42, reads "-C=C-," should read -- -C≡C-, --

Signed and Sealed this

Eleventh Day of November, 2008

JON W. DUDAS
*Director of the United States Patent and Trademark Office*